United States Patent
Kim

(10) Patent No.: US 7,989,281 B2
(45) Date of Patent: Aug. 2, 2011

(54) METHOD FOR MANUFACTURING DUAL GATE IN SEMICONDUCTOR DEVICE

(75) Inventor: Hyun Phill Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 436 days.

(21) Appl. No.: 12/104,819

(22) Filed: Apr. 17, 2008

(65) Prior Publication Data

US 2009/0093097 A1    Apr. 9, 2009

(30) Foreign Application Priority Data

Oct. 5, 2007   (KR) .................. 10-2007-0100573

(51) Int. Cl.
*H01L 21/8238* (2006.01)

(52) U.S. Cl. ........ 438/199; 438/592; 438/653; 438/655; 438/656; 438/683; 438/685; 438/777; 257/E21.165; 257/E21.168

(58) Field of Classification Search .............. 438/592, 438/653, 655, 656, 660, 683, 685, 777; 257/E21.166, E21.168, E21.165
See application file for complete search history.

(56) References Cited

U.S. PATENT DOCUMENTS

| | | | | |
|---|---|---|---|---|
| 6,306,743 | B1* | 10/2001 | Lee | 438/592 |
| 6,800,543 | B2* | 10/2004 | Taguwa | 438/592 |
| 6,943,416 | B2* | 9/2005 | Hu | 257/412 |
| 7,541,269 | B2* | 6/2009 | Kim et al. | 438/592 |
| 2005/0020045 | A1* | 1/2005 | Taguwa | 438/592 |
| 2006/0208323 | A1 | 9/2006 | Anderson et al. | |
| 2007/0052043 | A1* | 3/2007 | Cha et al. | 257/412 |
| 2007/0290227 | A1 | 12/2007 | Liang et al. | |
| 2008/0061386 | A1* | 3/2008 | Taguwa | 257/412 |
| 2008/0081452 | A1* | 4/2008 | Kim et al. | 438/592 |
| 2008/0157205 | A1* | 7/2008 | Sung et al. | 257/365 |

FOREIGN PATENT DOCUMENTS

JP    2005-116693    4/2005
KR    10-0744108    7/2007

* cited by examiner

*Primary Examiner* — Toniae M Thomas

(57) ABSTRACT

Provided is a method for manufacturing a dual gate in a semiconductor device. The method includes forming a gate insulating layer and a gate conductive layer on a semiconductor substrate, forming a diffusion barrier layer on the gate conductive layer, forming a barrier metal layer on the diffusion barrier layer, depositing a first gate metal layer on the barrier metal layer, forming a metal nitride barrier layer on a surface of the first gate metal layer by supplying nitrogen (N2) plasma on the first gate metal layer, forming a second gate metal layer on the metal nitride barrier layer, and forming a hard mask layer on the second gate metal layer.

12 Claims, 7 Drawing Sheets

METHOD FOR MANUFACTURING DUAL GATE IN SEMICONDUCTOR DEVICE

CROSS-REFERENCE TO RELATED APPLICATIONS

Priority to Korean patent application number 10-2007-0100573, filed on Oct. 5, 2007, which is incorporated by reference in its entirety, is claimed.

BACKGROUND

This patent relates to a semiconductor device, and more particularly, to a method for manufacturing a dual gate in a semiconductor device.

A semiconductor device, especially a dynamic random access memory (DRAM), has a cell region and a peripheral circuit region. In particular, the peripheral circuit region includes a complementary metal oxide semiconductor (CMOS) transistor. In a general CMOS transistor, a p-type MOS transistor has a buried channel structure. In the buried channel structure, the length of a channel becomes shorter as the integration degree of a device increases. Accordingly, an application of higher electric field may cause degradation of the leakage current characteristics of the semiconductor device. Therefore, a dual gate structure has been employed to realize a p-type MOS transistor having a surface channel structure in recent years.

In a process for manufacturing the dual gate, a gate conductive layer is formed on a gate insulating layer. N-type dopant is implanted into a region in which an n-type MOS transistor is formed, and a p-type dopant is implanted into a region in which a p-type MOS transistor is formed. A thermal diffusion process is performed on an entire semiconductor substrate so that the implanted dopant may be sufficiently diffused on the gate. In the dual gate formed on the semiconductor substrate as described above, the p-type gate implanted with the p-type dopant is formed on the region in which the p-type MOS transistor is disposed, and the n-type gate implanted with the n-type dopant is formed on the region in which the n-type MOS transistor is disposed. The dual gate has a structure with a plurality of metal films stacked on the gate conductive layer and a barrier metal layer interposed between the metal films. In this structure, a process for forming the metal film may be complicated and unstable. Moreover, an etching process for patterning a gate stack may not be easily performed because there are many etch target layers. Accordingly, a gate stack structure is required for stably performing the process of manufacturing the semiconductor device.

SUMMARY OF THE INVENTION

Embodiments of the present invention are directed to a method for manufacturing a dual gate in a semiconductor device.

In one embodiment, a method for manufacturing a dual gate in a semiconductor device includes: forming a gate insulating layer and a gate conductive layer over a semiconductor substrate; forming a diffusion barrier layer over the gate conductive layer; forming a barrier metal layer over the diffusion barrier layer; depositing a first gate metal layer over the barrier metal layer; forming a metal nitride barrier layer on a surface of the first gate metal layer by supplying nitrogen (N2) plasma on the first gate metal layer; forming a second gate metal layer over the metal nitride barrier layer; and forming a hard mask layer over the second gate metal layer.

The diffusion barrier layer may include a titanium (Ti) film, and the barrier metal layer may include a tungsten nitride (WN) film. The first gate metal layer may include a tungsten silicide (WSix) film, and the second gate metal layer may include a tungsten (W) film.

The first gate metal layer may be formed using a physical vapor deposition (PVD) process.

The method may further include performing a thermal treatment process over the semiconductor substrate after the forming of the metal nitride barrier layer.

In another embodiment, a method for manufacturing a dual gate in a semiconductor device includes: forming a gate insulating layer over a semiconductor substrate on which a first region and a second region are defined; forming a first conductivity-type gate conductive layer over the first region of the gate insulating layer, and forming a second conductivity-type gate conductive layer over the second region of the gate insulating layer; forming a diffusion barrier layer over the first and second conductivity-type gate conductive layers; forming a barrier metal layer over the diffusion barrier layer; forming a first gate metal layer on the barrier metal layer by a physical vapor deposition process: forming a metal nitride barrier layer on the surface of the first gate metal layer by supplying a nitrogen plasma onto the first gate metal layer; forming a second gate metal layer over the metal nitride barrier layer; forming a hard mask layer on the second gate metal layer; and forming a gate stack by patterning the hard mask layer to the gate insulating layer.

DESCRIPTION OF SPECIFIC EMBODIMENTS

Hereinafter, a method for manufacturing a dual gate in a semiconductor device in accordance with embodiments of the present invention will be described in detail with reference to the accompanying drawings.

Figure 1:
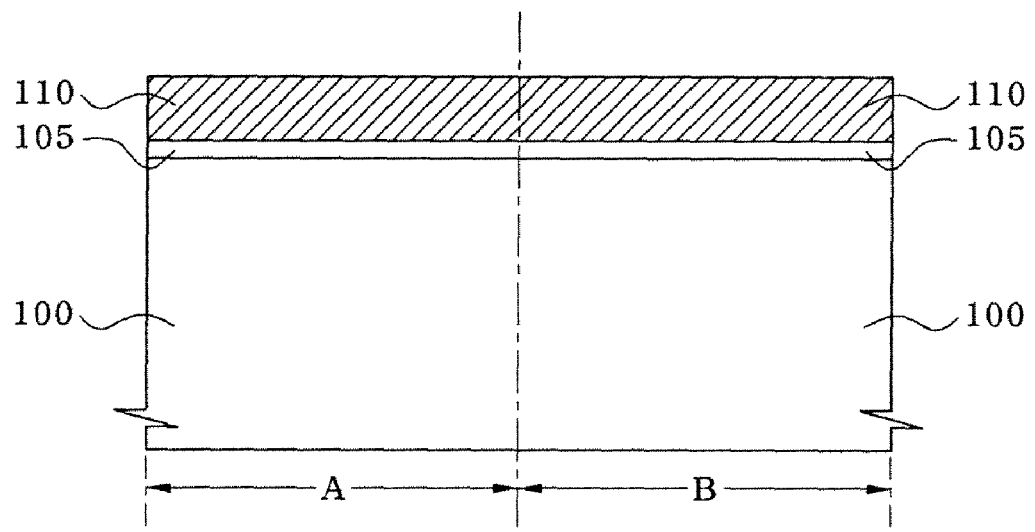
FIGS. 1 to 9 illustrate a method for manufacturing a dual gate in a semiconductor device according to an embodiment of the present invention.

Referring to FIG. 1, a gate insulating layer 105 is formed on a semiconductor substrate 100 having a first region A and a second region B. The first region A is a region on which a p-type MOS transistor is disposed. The second region B is a region on which an n-type MOS transistor is disposed. The gate insulating layer 105 may be formed of silicon oxide (SiO2) by a reaction between a silicon (Si) component in the substrate and an oxidant source which is supplied onto the semiconductor substrate 100. Next, a gate conductive layer 110 is formed on the gate insulating layer 105. The gate conductive layer 110 may be a silicon (Si) film. The Si film may be a polysilicon film implanted with dopant, or an amorphous silicon film without the dopant. When dopant is implanted into the gate conductive layer 110, phosphorus (p) ion may exist in the gate conductive layer 110.

Figure 2:
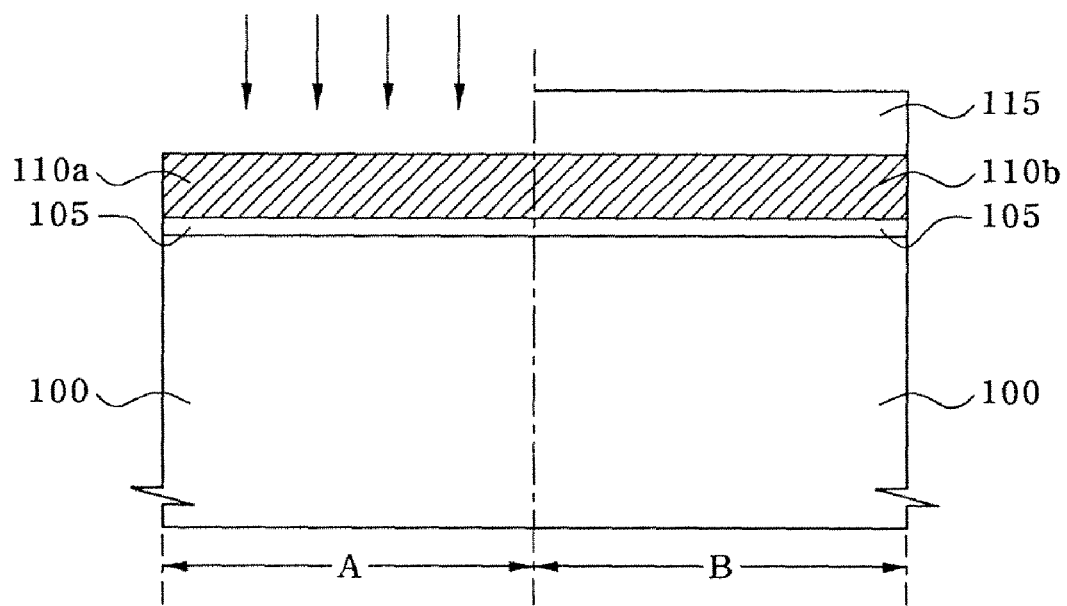

Referring to FIG. 2, a mask layer pattern 115 is formed to expose the first region A on the gate conductive layer 110 and simultaneously to cover the second region B on the gate conductive layer 110. The mask layer pattern 115 may be formed by coating and patterning a photoresist. As indicated by arrows in FIG. 2, an ion implantation process is performed using the mask layer pattern 115 as an ion implantation barrier layer. In the ion implantation process, a p-type dopant ion (e.g., boron (B) ion or fluoride boron (BF2)) is implanted into the first region A of the gate conductive layer 110. Subsequently, a first gate conductive layer 110a implanted with the p-type dopant ion is formed in the first region A, and a second gate conductive layer 110b implanted with the n-type dopant ion is formed in the second region B. After this ion implantation process, the mask layer pattern 115 is removed.

Figure 3:
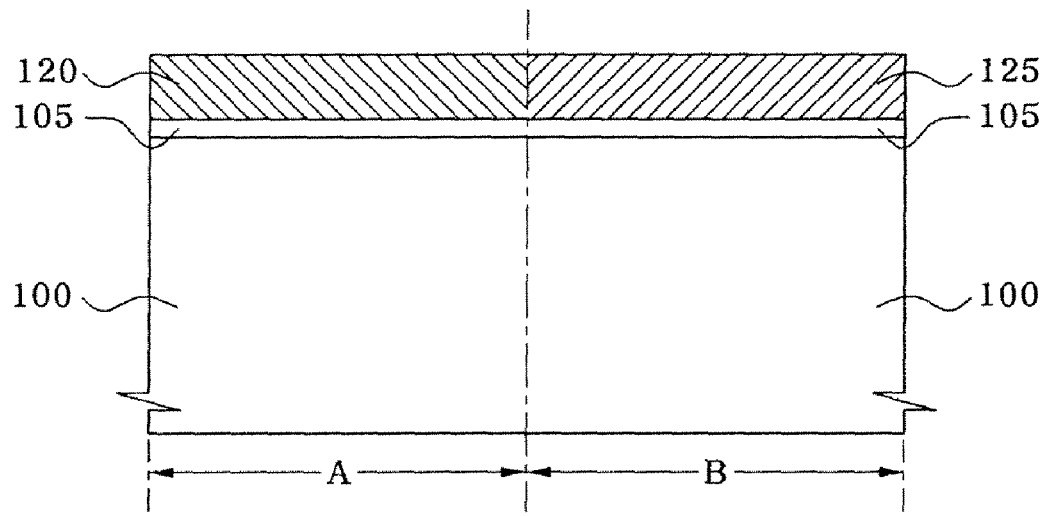

Referring to FIG. 3, a thermal treatment is performed on the semiconductor substrate 100 to activate the dopant ions implanted into the first and second gate conductive layers 110a and 110b. Through the thermal treatment, a p-type gate conductive layer 120 is formed in the first region A, and an n-type gate conductive layer 125 is formed in the second region B.

Figure 4:
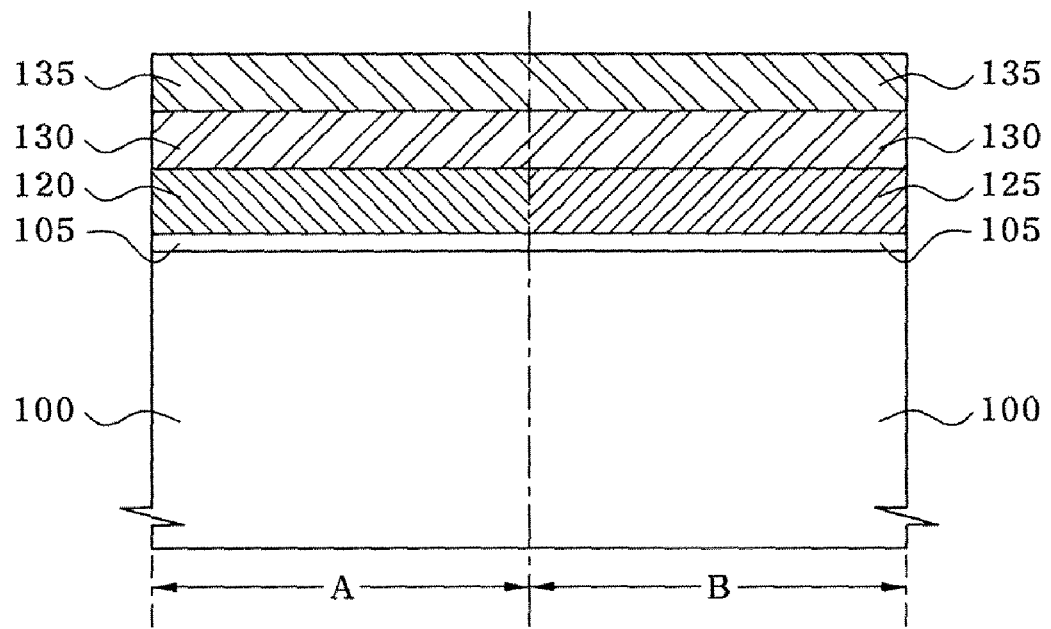

Referring to FIG. 4, a diffusion barrier layer 130 is deposited on the p-type gate conductive layer 120 and the n-type gate conductive layer 125. The diffusion barrier layer 130 may be a titanium (Ti) film. The diffusion barrier layer 130 deposited on the p-type and n-type gate conductive layers 120 and 125 reduces electrode resistance, and prevents dopants implanted into the p-type and n-type gate conductive layers 120 and 125 in a subsequent thermal treatment process from being diffused into a direction of a metal film. Next, a barrier metal layer 135 is formed on the diffusion barrier layer 130. The barrier metal layer 135 may be a tungsten nitride (WN) film. The barrier metal layer 135 restrains silicon (Si) components of the p-type and n-type gate conductive layers 120 and 125 from being excessively diffused into a upward direction by the reaction between the diffusion barrier layer 130 and a first gate metal layer (140 in FIG. 5) in the a subsequent thermal process. The barrier metal layer 135 forms a titanium nitride (TiN) film on an interface between the diffusion barrier layer 130 and the barrier metal layer 135 during the thermal treatment process.

Figure 5:
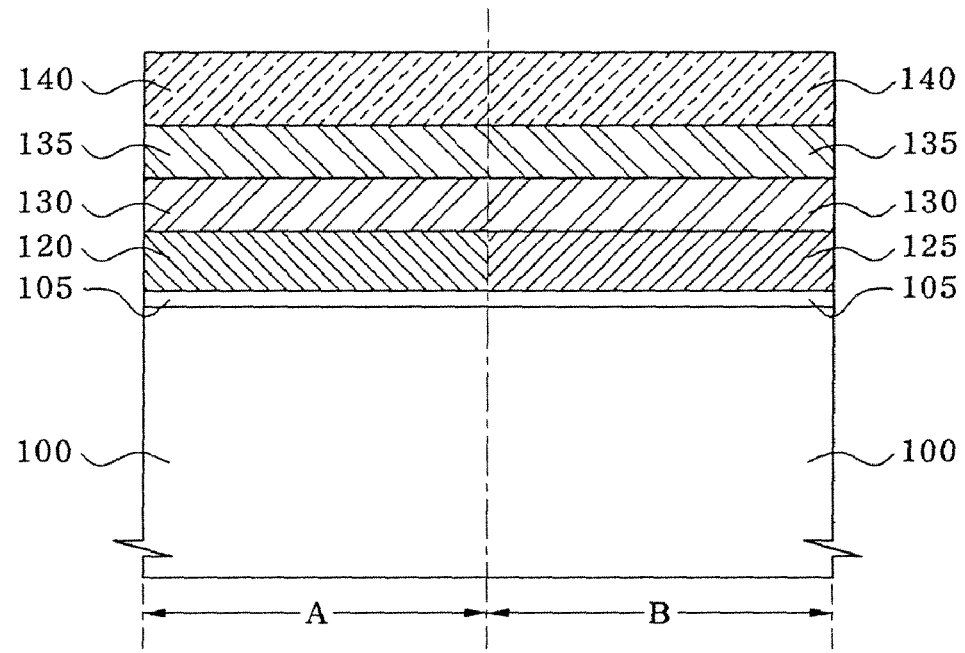

Referring to FIG. 5, a first gate metal layer 140 is formed on the barrier metal layer 135. The first gate metal layer 140 may be formed of tungsten silicide (WSix) through a physical vapor deposition (PVD) process. The first gate metal layer 140 is formed using the PVD process instead of a conventional chemical vapor deposition (CVD) process. The first gate metal layer 140 reduces the sheet resistance (Rs) of a second gate metal layer to be subsequently formed.

Figure 6:
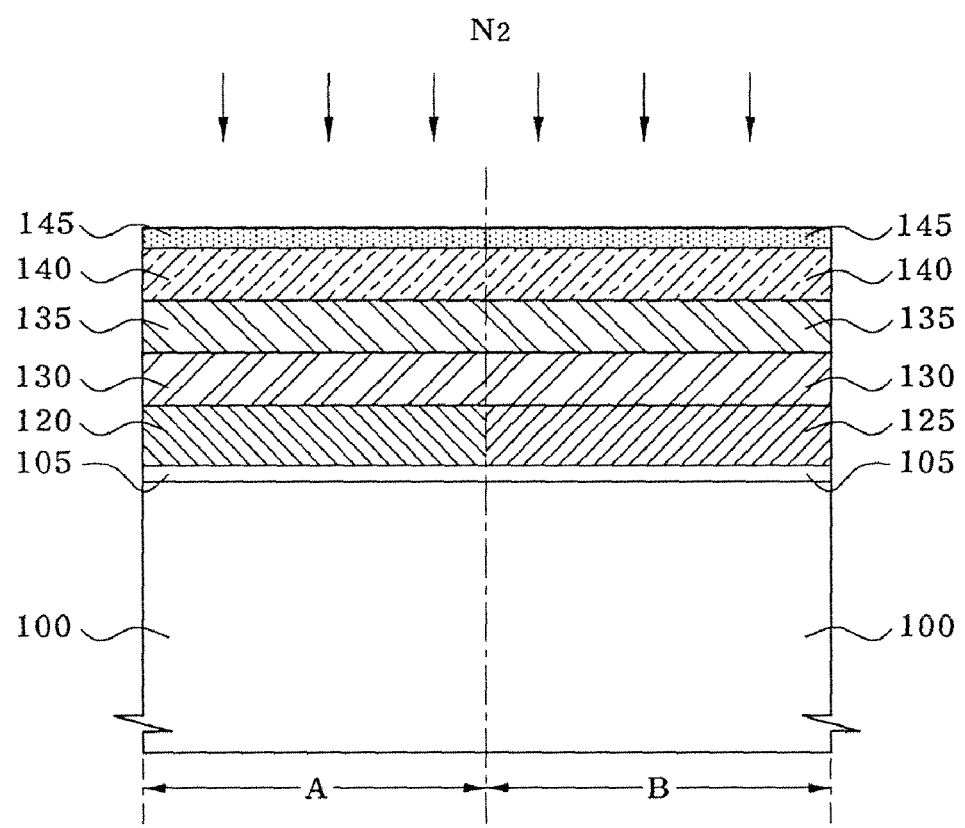

Referring to FIG. 6, a treatment using nitrogen (N2) plasma is performed over the semiconductor substrate 100 on which the first gate metal layer 140 is formed. Specifically, the semiconductor substrate 100 with layers stacked up to and including the first gate metal layer 140 is loaded into a reaction chamber. Next, a plasma source gas including a nitrogen (N2) gas is supplied into the reaction chamber accommodated with the semiconductor substrate 100. Together with the above process, a proper bias is applied to generate a nitrogen plasma. Then, a metal nitride barrier layer 145 is formed on the surface of the first gate metal layer 140 by a reaction between the nitrogen plasma generated in the reaction chamber and the first gate metal layer 140. The metal nitride barrier layer 145 restrains an interface reaction which may occur between two adjacent layers by being located between the first gate metal layer 140 and a second gate metal layer to be formed in a next process. The amorphous metal nitride barrier layer 145 formed on the surface of the first gate metal layer 140 by the nitrogen plasma may reduce the sheet resistance (Rs) of the metal film. In this case, the metal nitride barrier layer 145 is a seed film for increasing the grain size of the metal film in a process of forming the second gate metal layer subsequently.

Figure 7:
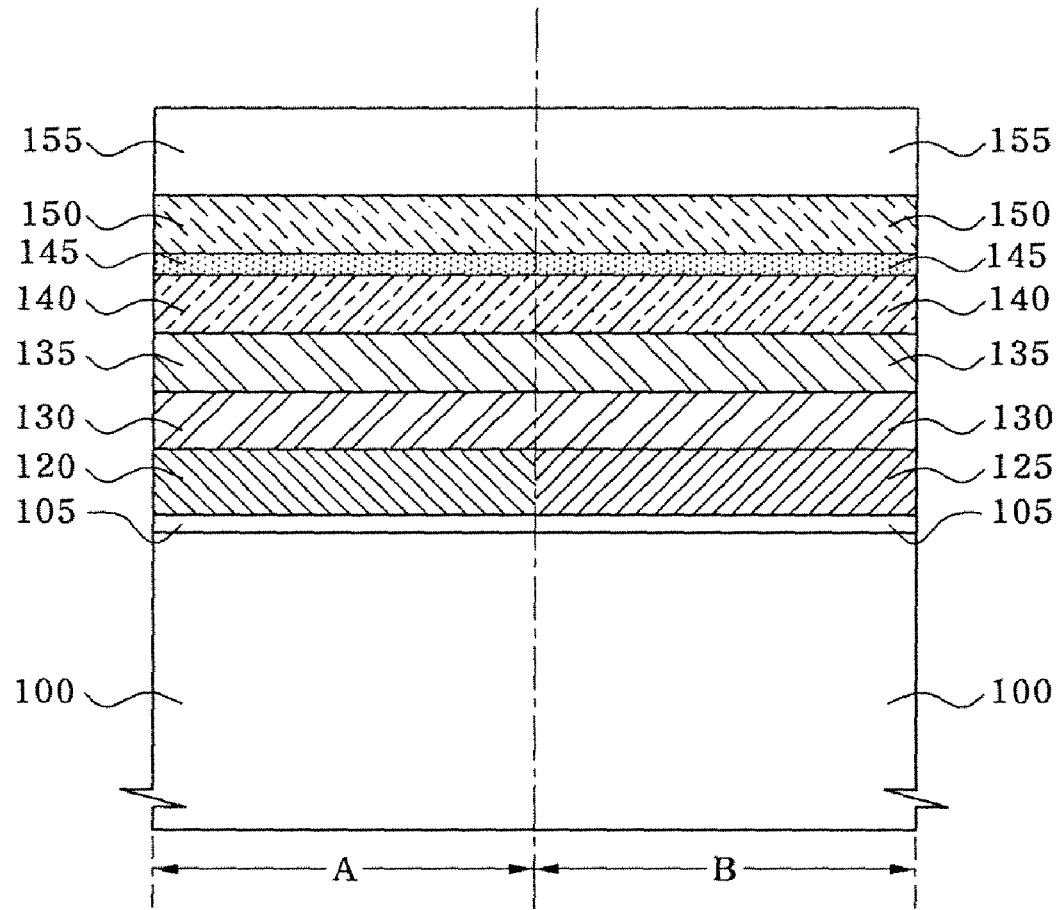
Figure 8:
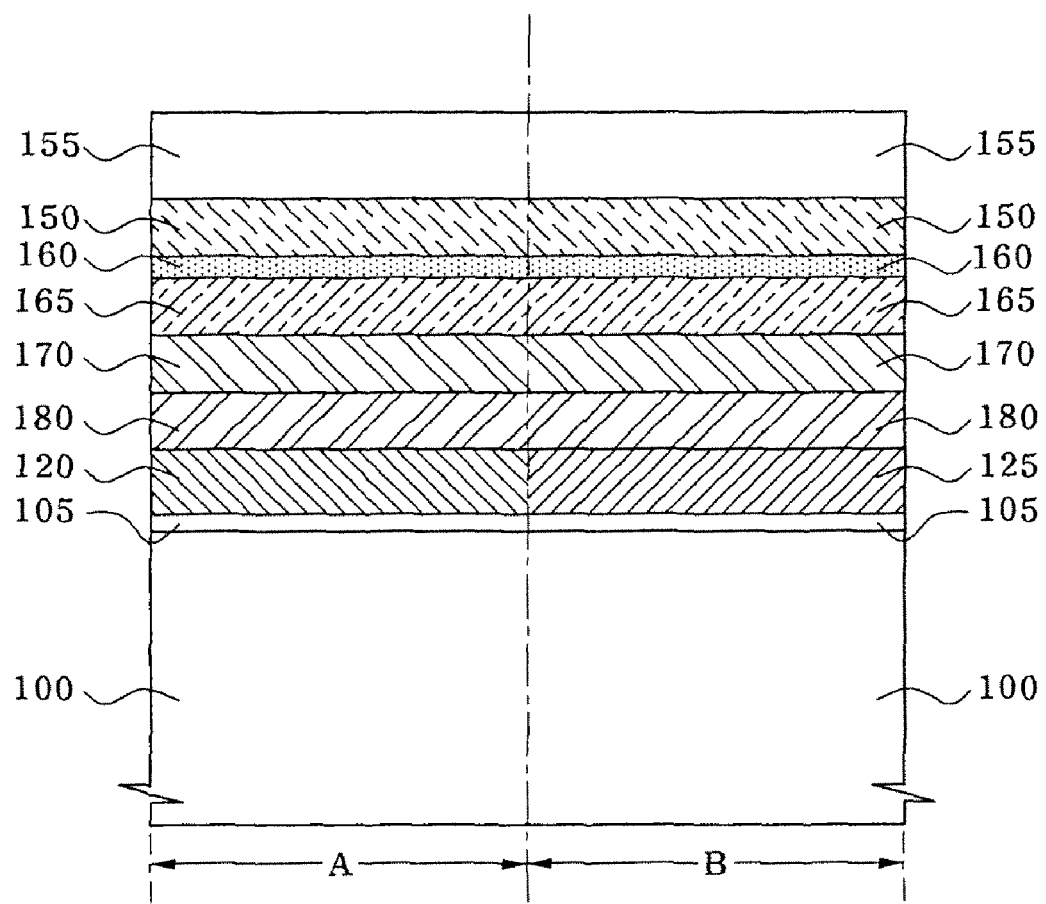

Referring to FIGS. 7 and 8, a second gate metal layer 150 and a hard mask layer 155 are formed on the metal nitride barrier layer 145. The second gate metal layer 150 maybe formed of tungsten (W) and the hard mask layer 155 maybe formed of silicon nitride (SiN). Next, a subsequent thermal treatment is performed. As illustrated in FIG. 8, a titanium silicide/titanium nitride (TiSix/TiN) film 180 is formed from an interface reaction between the diffusion barrier layer (Ti) 130 and the gate conductive layers (Si) 120 and 125 and the barrier metal layer (WN) 135. A second diffusion barrier layer (WSiN) 160 is formed from an interface reaction between the first gate metal layer (WSix) 140 and the metal nitride barrier layer 145.

Figure 10:
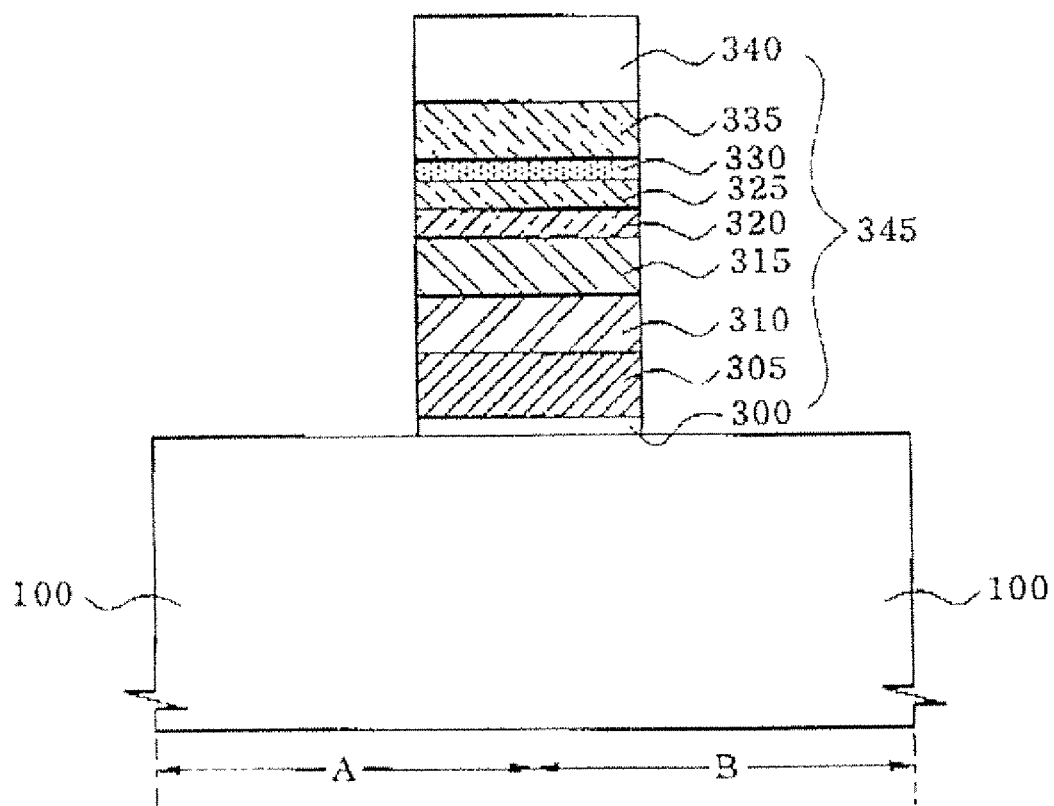
FIG. 10 illustrates a typical dual gate schematically.

The conventional dual gate structure includes a gate conductive layer stacked with a plurality of metal films and a barrier metal layer interposed between the metal films. Referring to FIG. 10, the conventional dual gate 345 has a structure including layers stacked with a gate insulating layer 300, a gate conductive layer 305, a titanium (Ti) film 310, a first tungsten nitride (WN) film 315, a titanium nitride (TiN) film 320, a tungsten silicide (WSix) film 325, a second tungsten nitride (WN) film 330, a tungsten (W) film 335 and a hard mask layer 340. However, in this structure including layers stacked with a plurality of metal films and a barrier metal layer, a process for forming the metal film may be complicated and unstable. Moreover, an etching process may not be easily performed because there are many etch target layers. On the other hand, a method for manufacturing a dual gate according to an embodiment of the present invention can reduce the process steps by omitting a titanium nitride (TiN) film which is a glue layer for forming a tungsten silicide (WSix) film using a chemical vapor deposition (CVD) process. Furthermore, the method omits a seed layer by nitride-treating the surface of the first gate metal layer 140 using a nitrogen plasma in order to increase the grain size of the second gate metal layer 150, thereby reducing the process steps.

Figure 9:
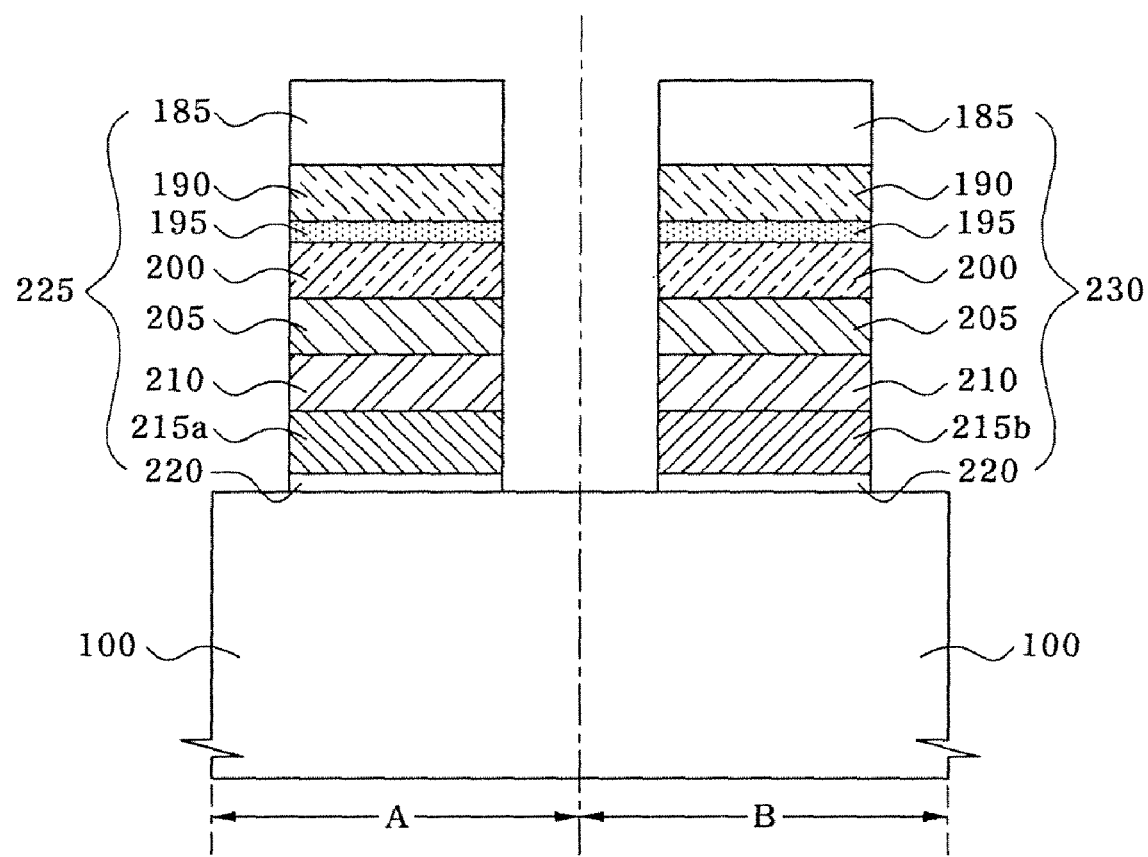

Referring to FIG. 9, a gate stack is formed by patterning the hard mask layer 155 or the gate insulating layer 105. That is, a photoresist layer pattern (not shown) defining a gate stack region is formed by coating and patterning a photoresist layer on the hard mask layer 155. The photoresist layer may be formed using a spin coating process. Next, a hard mask layer pattern 185 is formed by etching the hard mask layer 155 using the photoresist layer pattern as a mask. Subsequently, the photoresist layer pattern is removed using an ashing process. Next, lower layers are etched using the hard mask pattern 185 as a mask to form dual gate stacks 225 and 230 stacked with a gate insulating layer pattern 220, gate conductive layer patterns 215a and 215b, a first diffusion barrier layer pattern 210, a barrier metal layer pattern 205, a first gate metal layer pattern 200, a second diffusion barrier layer pattern 195, a second gate metal layer pattern 190 and a hard mask pattern 185.

The method for manufacturing a dual gate according to the embodiments of the present invention can reduce the process steps by simplifying a gate stack structure, thereby performing the stable process steps by reducing a load on an etching process.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for manufacturing a dual gate in a semiconductor device, the method comprising:
   forming a gate insulating layer and a gate conductive layer over a semiconductor substrate;
   forming a diffusion barrier layer comprising titanium over the gate conductive layer;

forming a barrier metal layer over the diffusion barrier layer comprising titanium;

depositing a first gate metal layer over the barrier metal layer;

forming a metal nitride barrier layer on a surface of the first gate metal layer by supplying nitrogen ($N_2$) plasma on the first gate metal layer;

forming a second gate metal layer over the metal nitride barrier layer; and forming a hard mask layer over the second gate metal layer, wherein the metal nitride barrier layer is formed by a reaction between the nitrogen plasma and the metal of the first gate metal layer.

2. The method of claim 1, wherein the first gate metal layer comprises a tungsten silicide (WSix) film.

3. The method of claim 1, wherein the second gate metal layer comprises a tungsten (W) film.

4. The method of claim 1, wherein the barrier metal layer comprises a tungsten nitride (WN) film.

5. The method of claim 1, wherein the first gate metal layer is formed using a physical vapor deposition (PVD) process.

6. The method of claim 1, further comprising performing a thermal treatment process over the semiconductor substrate after the forming of the metal nitride barrier layer.

7. A method for manufacturing a dual gate in a semiconductor device, the method comprising:

forming a gate insulating layer over a semiconductor substrate on which a first region and a second region are defined;

forming a first conductivity-type gate conductive layer on the first region of the gate insulating layer, and forming a second conductivity-type gate conductive layer on the second region of the gate insulating layer;

forming a diffusion barrier layer over the first and second conductivity-type gate conductive layers;

forming a barrier metal layer over the diffusion barrier layer comprising titanium;

forming a first gate metal layer over the barrier metal layer by a physical vapor deposition process;

forming a metal nitride barrier layer on the surface of the first gate metal layer by supplying a nitrogen plasma onto the first gate metal layer;

forming a second gate metal layer over the metal nitride barrier layer;

forming a hard mask layer over the second gate metal layer; and forming a gate stack by patterning the hard mask layer to the gate insulating layer, wherein the metal nitride barrier layer is formed by a reaction between the nitrogen plasma and the metal of the first gate metal layer.

8. The method of claim 7, wherein the first conductivity-type gate conductive layer is implanted with a p-type dopant, and the second conductivity-type gate conductive layer is implanted with an n-type dopant.

9. The method of claim 7, wherein the first gate metal layer comprises a tungsten silicide (WSix) film.

10. The method of claim 7, wherein the second gate metal layer comprises a tungsten (W) film.

11. The method of claim 7, wherein the barrier metal layer comprises a tungsten nitride (WN) film.

12. The method of claim 8, further comprising performing a thermal treatment process over the semiconductor substrate after the forming of the metal nitride barrier layer.

* * * * *